BEST AVAILABLE COPY

F. W. MOFFAT.

ELECTRIC HEATING ELEMENT.

APPLICATION FILED JAN. 5, 1922.

Reissued Oct. 24, 1922. 15,477.

Inventor
F. W. Moffat.
By J. Edward Maybee.
Attorney

Reissued Oct. 24, 1922.

BEST AVAILABLE COPY

Re. 15,477

UNITED STATES PATENT OFFICE.

FREDERICK W. MOFFAT, OF WESTON, ONTARIO, CANADA.

ELECTRIC HEATING ELEMENT.

Original No. 1,323,084, dated November 25, 1919, Serial No. 228,228, filed April 12, 1918. Application for reissue filed January 5, 1922. Serial No. 527,242.

*To all whom it may concern:*

Be it known that I, FREDERICK W. MOFFAT, of the town of Weston, in the county of York, Province of Ontario, Canada, have invented certain new and useful Improvements in Electric Heating Elements, of which the following is a specification.

This invention relates to heating elements of the disk type in which the resistance wire is spirally arranged and connections with the terminals require to be made at the under side of the disk, and my object is to devise an element of this type in which the connections of the resistance wiring to the terminal posts are made at the under side of the disk and in which the resistance wire leads and the terminals are completely protected up to their joints of connection, whereby a maximum of protection against trouble caused by any displacement of the disk is obtained.

I attain my objects by means of the constructions hereinafter described and illustrated in the accompanying drawings in which—

Figure 1:
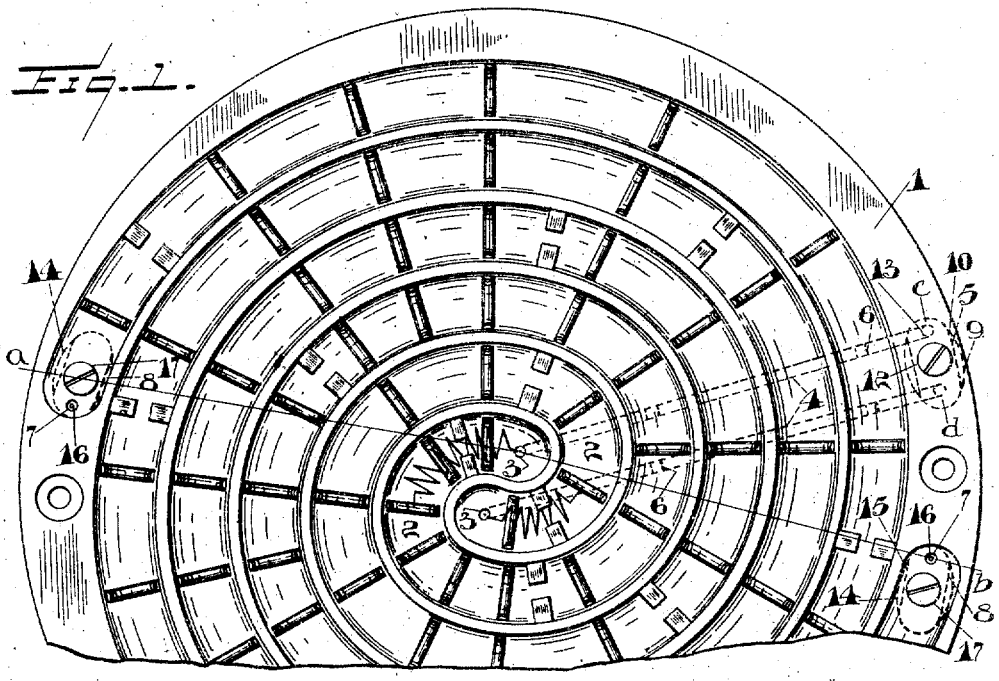
Figure 2:
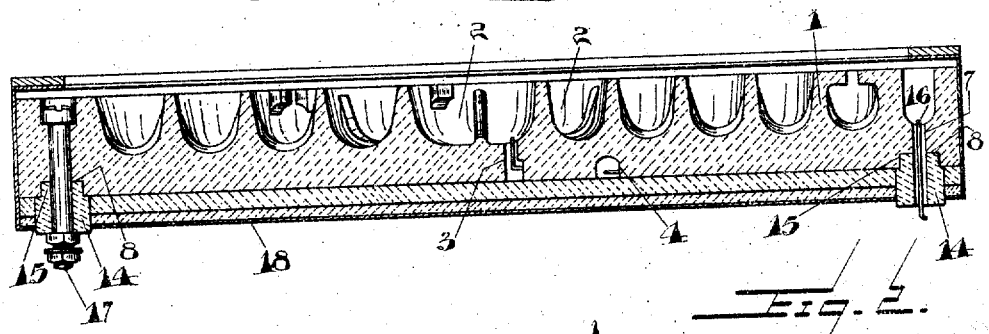

Fig. 1 is a plan view of the under side of the resistance carrying disk of an electric heating element constructed in accordance with my invention;

Fig. 2 a section of the line *a—b* in Fig. 1; and

Figure 3:
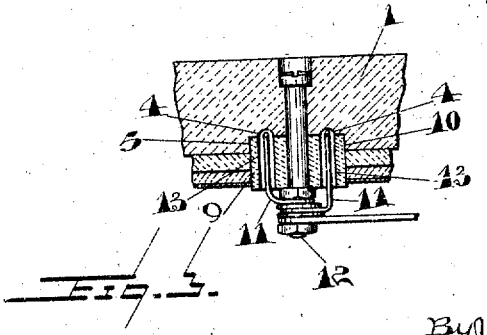

Fig. 3 a section on the line *c—d* in Fig. 1 showing also the metal containing pan.

In the drawings like numerals of reference indicate corresponding parts in the different figures.

1 is a disk of suitable insulating material such as commonly employed in the construction of electric heating elements. This disk is spirally grooved at its upper surface, preferably two grooves 2 being employed, each wound with a separate resistance. Each groove at the center of the disk communicates with a hole 3 extending through to the bottom of the disk. Each of these holes communicates with a groove 4 formed in the under side of the disk and extending to a recess 5 adjacent the edge of the disk. One or more bridges 6 are preferably formed over the grooves.

At the outer end of each groove 2 a hole 7 is formed extending through to the under side of the disk. About each of these holes is formed a recess 8. A block 9 of suitable insulating material is provided with a projection 10 adapted to fit into the recess 5 and to fill the same as exactly as possible consistent with an easy fit. The block is secured in place by means of the terminal 12, passing through both the disk and the block and formed as a bolt.

Through the block are formed the holes 13, through which the ends 11 of the resistance wire are led, being secured to the terminal at the under side of the block.

14 are blocks, each provided with a projection 15 adapted to fit into one of the recesses 8. Each of these blocks has a hole therein adapted to aline with the corresponding hole 7. Through these holes the outer ends 16 of the resistance coils are led and are connected to the corresponding terminals 17, which are formed as bolts passing through the disk and blocks and holding the latter in place.

It will be understood that the essence of my invention lies in bringing the ends of the resistance wiring through the disk and through holes in the blocks 14, at the lower ends of which they are connected to the bolts 17 which not only serve as terminals but also serve to secure the block 14 in position. It follows therefore that many variations may be made in the specific constructions for bringing the ends of the wiring to the holes in the block without departing from the spirit of my invention.

The disk is as usual fitted into a metal pan 18 containing heat insulating material and through holes in the bottom of the pan the terminal blocks pass. See Fig. 3. The connections where they lie in the grooves 4 have thus always been well protected but have not been so well protected adjacent the terminals, but it will be seen that with the constructions described the connections of the resistance wires are completely protected adjacent their points of connection with the terminals, so that no part can accidently contact with any part underneath the element in such a way as to cause danger.

It will be understood, of course, that the number of the terminal blocks employed will depend on the number of separate resistance employed. If only one resistance wire is coiled on the surface of the disk, two blocks only will be necessary. With more separate resistance circuits a larger number might be employed. For the sake of standardization all blocks will be made

BEST AVAILABLE COPY from the same mold so that each block will be provided with two holes for the passage of the connections though in the case of the blocks 14 only one is essential.

What I claim as my invention is:—

1. In an electric heating element, the combination of resistance wire, a disk of insulating material adapted at its upper side to receive the resistance wire and having an opening therethrough for the passage of an end of the wire to the under side of the disk; a separate block of insulating material fitting against the lower surface of the disk; a bolt passing through the disk and block and serving as a terminal and also as a means to hold the block in place, said block having a hole formed therein through which the end of the resistance wiring is led and connected to the bolt below the disk at the lower end of the block.

2. In an electric heating element, the combination of resistance wire; a disk of insulating material adapted at its upper side to receive the resistance wire and having a plurality of openings therethrough for the passage of ends of the resistance wiring to the under side of the disk; a plurality of separate blocks of insulating material fitting against the under side of the disk towards its outer edge; bolts passing through the disks and block serving as terminals and also as means to hold the blocks in place, said blocks having holes formed therein through which the ends of the resistance wiring are led and connected to the bolts below the disk at the lower end of the block.

3. In an electric heating element, the combination of a disk of insulating material adapted at its upper side to receive a resistance and having two holes formed therein for the passage of resistance connections to the underside of the disk, recesses being formed in the underside of the disk with which said holes communicate; blocks of insulating material separate from the disk provided with projections adapted to fit into said recesses; terminal bolts passing through the disk and the blocks and serving to secure the latter in place, holes being provided in the blocks alining with the aforesaid holes in the disk and resistance wire carried at the upper side of the disks having its ends brought down through the holes in the disks and blocks and connected with the terminal bolts at the under side of the blocks.

4. In an electric heating element, the combination of a disk of insulating material adapted at its upper side to receive a resistance and having two holes formed therein adjacent its outer edge and two holes at the center for the passage of resistance connections to the under side of the disk, recesses being formed in the underside of the disk with which said first mentioned holes communicate; and a third recess also adjacent the edge communicating with two grooves formed in the underside of the disk and leading to the central holes; blocks of insulating material separate from the disk provided with projections adapted to fit into said recesses; terminal bolts passing through the disk and the blocks and serving to secure the latter in place, holes being provided in the blocks alining with the aforesaid holes in the disk and resistance wire carried at the upper side of the disks having its ends brought down through the holes in the disks and blocks and connected with the terminal bolts at the under side of the blocks.

5. In an electric heating element, the combination of a disk of insulating material adapted at its upper side to receive a resistance and having a hole formed therein adjacent its outer edge and a hole at the center for the passage of resistance connections to the under side of the disk and a groove leading from the central hole to a point adjacent the outer edge of the disk; two blocks of insulating material separate from the disk each having a hole therein extending from top to bottom in alinement with the groove and hole respectively; terminal bolts passing through the disk and blocks and serving to secure the latter in place and resistance wire carried at the upper side of the disks having its ends brought down through the holes in the disks and blocks and connected with the terminal bolts at the under side of the blocks.

Signed at Toronto, Ont., this 16th day of December, 1921.

FREDERICK W. MOFFAT.